United States Patent
Fujiwara

(10) Patent No.: US 6,194,921 B1
(45) Date of Patent: Feb. 27, 2001

(54) ANALOG SIGNAL AMPLIFIER CIRCUIT USING A DIFFERENTIAL PAIR OF MOSFETS (INSULATED-GATE FIELD EFFECT TRANSISTORS) IN AN INPUT STAGE

(75) Inventor: Takashi Fujiwara, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/492,190

(22) Filed: Jan. 27, 2000

(30) Foreign Application Priority Data

Jan. 27, 1999 (JP) .................................................. 11-018630

(51) Int. Cl.$^7$ ..................................................... H03F 3/45
(52) U.S. Cl. .................................. 327/65; 327/52; 327/53
(58) Field of Search .................................. 327/52, 53, 65, 327/66, 562, 563, 77, 78, 79, 80, 81, 88, 89; 330/253, 254, 257

(56) References Cited

U.S. PATENT DOCUMENTS

| | | | |
|---|---|---|---|
| 5,552,729 | * 9/1996 | Deguchi | 327/103 |
| 5,602,509 | * 2/1997 | Kimura | 330/253 |
| 5,712,594 | * 1/1998 | Kimura | 330/253 |
| 5,764,086 | 6/1998 | Nagamatsu et al. | 327/65 |
| 5,999,055 | * 12/1999 | Kimura | 330/255 |

FOREIGN PATENT DOCUMENTS 9-74340   3/1997  (JP) .

* cited by examiner

*Primary Examiner*—Tuan T. Lam
*Assistant Examiner*—Hiep Nguyen
(74) *Attorney, Agent, or Firm*—Oblon, Spivak, McClelland, Maier & Neustadt, P.C.

(57) ABSTRACT

The present invention provides a limiter amplifier using a differential pair of MOS transistors in an input stage. A plurality of MOS transistors each having a drain and a gate connected to each other as a load transistor, are connected in series to the drains of the differential pair of MOS transistors in the input stage. MOS transistors are current-mirror-connected to the load transistors to perform feedback on the differential pair of MOS transistors in the input stage. The outputs of the differential pair of MOS transistors in the input stage are amplified by another differential pair of MOS transistors in an output stage.

20 Claims, 3 Drawing Sheets

ANALOG SIGNAL AMPLIFIER CIRCUIT USING A DIFFERENTIAL PAIR OF MOSFETS (INSULATED-GATE FIELD EFFECT TRANSISTORS) IN AN INPUT STAGE

BACKGROUND OF THE INVENTION

The present invention relates to an analog signal amplifier circuit integrated on a semiconductor integrated circuit and, more specifically, to an analog signal amplifier circuit using a differential pair of MOSFETs (insulated-gate field effect transistors) in an input stage.

In most prior art semiconductor integrated circuits, a voltage-amplitude limiter circuit (limiter amplifier) and a voltage comparator circuit (comparator) for amplifying an analog signal, which are called an analog signal amplifier circuit, are each constituted of a bipolar transistor.

The trend is to constitute an analog signal amplifier circuit using MOS transistors in place of bipolar transistors with recent technological advances. However, the mutual conductance gm of a MOS transistor is smaller than that of a bipolar transistor and has a characteristic that it is proportionate to both the (½)th power of a drain current and the (½)th power of the ratio of gate width to gate length of the transistor. Therefore, an analog signal amplifier circuit using a differential pair of PMOS transistors M1 and M2 in an input stage, as shown in FIG. 1, has the following problem.

If the mutual conductance gm of the above PMOS transistors M1 and M2 is tenfold in order to achieve a high gain, the drain current or the gate width should be increased hundredfold in view of the above characteristic, which produces a bad effect of greatly increasing the current consumption and the area of an integrated circuit. Such an amplifier circuit is thus impractical.

BRIEF SUMMARY OF THE INVENTION

The object of the present invention is to provide a signal amplifier circuit capable of easily achieving a high gain without greatly increasing the current consumption or the area of an integrated circuit even when a differential pair of MOS transistors is used in an input stage.

In order to attain the above object, there is provided a signal amplifier circuit comprising:

a first differential pair of a first MOS transistor of a first conductivity type and a second MOS transistor of the first conductivity type, a source of the first MOS transistor and a source of the second MOS transistor being connected to each other;

a first constant-current source connected to a common source-connection node of the first and second MOS transistors of the first differential pair;

a first bias supply source connected to a drain of the first MOS transistor and connected in series to a third transistor whose drain and gate are connected to each other and a fourth transistor of a second conductivity type whose drain and gate are connected to each other;

a fifth MOS transistor of the second conductivity type constituting a first current mirror circuit together with the fourth MOS transistor, a gate and a source of the fifth MOS transistor being connected to the gate and source of the fourth MOS transistor, and a drain of the fifth MOS transistor being connected to a drain of the second MOS transistor;

a second bias supply source connected to the drain of the second MOS transistor and connected in series to a sixth transistor whose drain and gate are connected to each other and a seventh MOS transistor of the second conductivity type whose drain and gate are connected to each other;

an eighth MOS transistor of the second conductivity type constituting a second current mirror circuit together with the seventh MOS transistor, a gate and a source of the eighth MOS transistor being connected to the gate and source of the seventh MOS transistor, and a drain of the eighth MOS transistor being connected to the drain of the first MOS transistor;

a second differential pair of a ninth MOS transistor of the second conductivity type and a tenth MOS transistor of the second conductivity type, a source of the ninth MOS transistor and a source of the tenth MOS transistor being connected to each other, a gate of the ninth MOS transistor being connected to a drain of the first MOS transistor, and a gate of the tenth MOS transistor being connected to the drain of the second MOS transistor; and a second constant-current source connected to a common source-connection node of the ninth and tenth MOS transistors of the second differential pair.

The signal amplifier circuit according to the present invention is virtually increased in conductance. If, therefore, the first and second current mirror circuits are varied in current mirror ratio, an arbitrary high gain can be obtained.

If, in particular, a plurality of MOS transistors are added as loads of the first and second MOS transistors constituting the first differential pair, a higher gain can be achieved.

If, furthermore, the ratio of gate width to gate length of each of the ninth and tenth MOS transistors constituting the second differential pair, is caused to differ from that of gate width to gate length of each of the MOS transistors constituting the first and second bias supply sources, an arbitrary high gain can be achieved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.

(First Embodiment)

Figure 1:
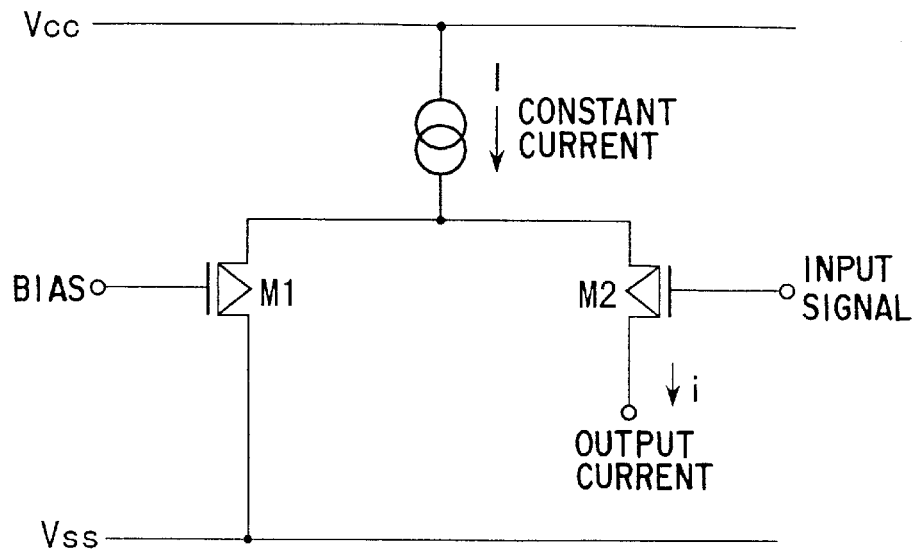
FIG. 1 is a circuit diagram showing a limiter amplifier using a differential pair of MOS transistors in an input stage in order to describe a prior art amplifier circuit and its problem.
Figure 2:
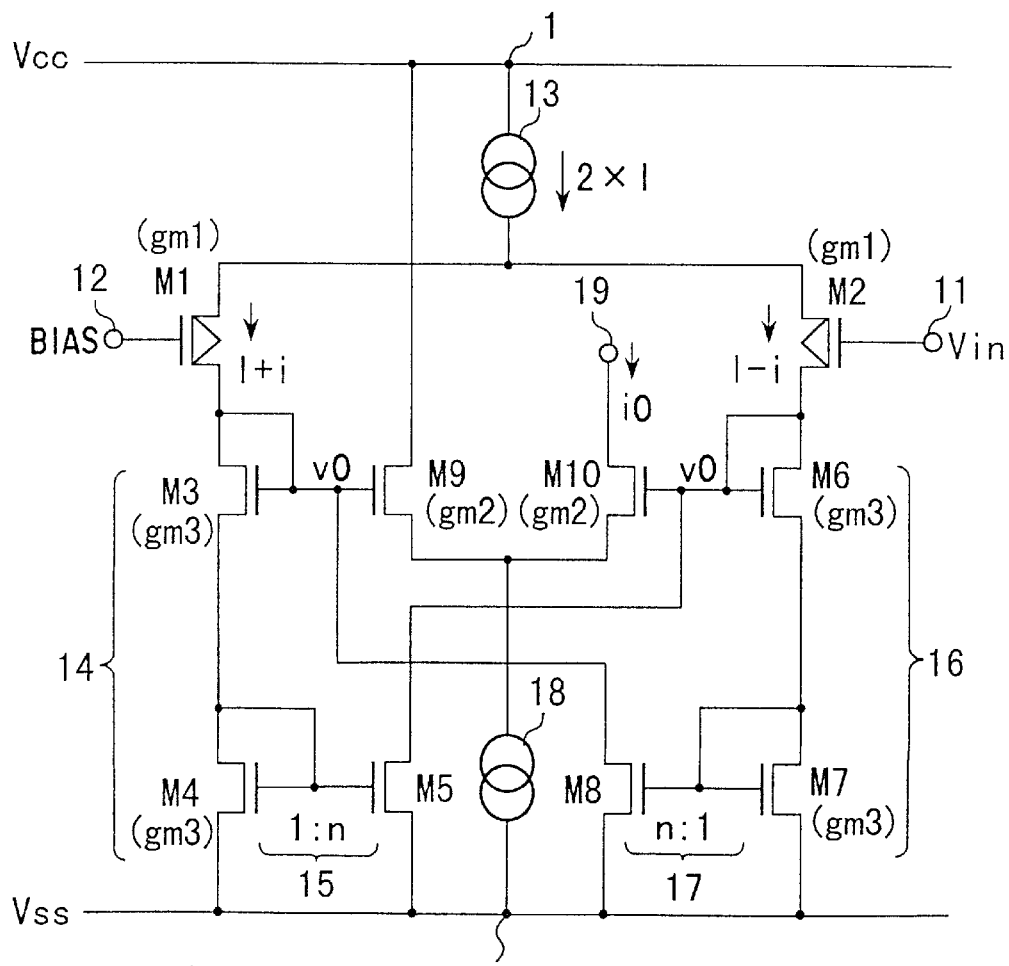
FIG. 2 is a circuit diagram schematically showing a limiter amplifier according to a first embodiment of the present invention.

FIG. 2 shows an example of an arrangement of a limiter amplifier according to a first embodiment of the present invention. The first embodiment is directed to a PMOS top amplifier circuit.

In FIG. 2, M1 and M2 indicate P-channel type first and second MOS transistors (first and second PMOS transistors), respectively, to serve as an input stage of the amplifier circuit. The sources of the first and second PMOS transistors M1 and M2 are connected to each other to constitute a first differential pair.

A first constant-current source 13 is connected between a common source-connection node of the first and second PMOS transistors (first differential pair of transistors) M1 and M2 and a first power supply node 1 to which a power supply voltage Vcc is applied. The first constant-current source 13 supplies a constant current to the first and second PMOS transistors M1 and M2.

A bias terminal 12 is connected to the gate of the first PMOS transistor M1, while a signal input terminal 11 is connected to the gate of the second PMOS transistor M2.

A first bias supply source 14 is connected between the drain of the first PMOS transistor M1 and a second power supply node 2 to which a ground potential Vss is applied. In the first embodiment, the first bias supply source 14 is formed by series-connecting an N-channel type third MOS transistor (third NMOS transistor) M3 whose drain and gate are connected to each other and an N-channel type fourth MOS transistor (fourth NMOS transistor) M4 whose drain and gate are connected to each other.

The gate and source of an N-channel type fifth MOS transistor (fifth NMOS transistor) M5 are connected to the gate and source of the fourth NMOS transistor M4, respectively, and the drain thereof is connected to that of the second PMOS transistor M2. The fourth and fifth NMOS transistors M4 and M5 constitute a first current mirror circuit 15 (these transistors are therefore called transistors for a current mirror).

A second bias supply source 16 is connected between the drain of the second PMOS transistor M2 and the second power supply node 2. In the first embodiment, the second bias supply source 16 is formed by series-connecting an N-channel type sixth MOS transistor (sixth NMOS transistor) whose drain and gate are connected to each other and an N-channel type seventh MOS transistor (seventh NMOS transistor) whose drain and gate are connected to each other.

The gate and source of an N-channel type eighth MOS transistor (eighth NMOS transistor) M8 are connected to the gate and source of the seventh NMOS transistor M7, respectively, and the drain thereof is connected to that of the first PMOS transistor M1. The seventh and eighth NMOS transistors M7 and M8 constitute a second current mirror circuit 17 (these transistors are therefore called transistors for a current mirror).

In FIG. 2, M9 and M10 indicate N-channel type ninth and tenth MOS transistors (ninth and tenth NMOS transistors), respectively, to serve as an output stage of the amplifier circuit. The sources of the ninth and tenth NMOS transistors M9 and M10 are connected to each other to constitute a second differential pair.

A second constant-current source 18 is connected between a common source-connection node of the ninth and tenth NMOS transistors (the second differential pair of transistors) M9 and M10 and the second power supply node 2 in order to supply a constant current to the ninth and tenth NMOS transistors M9 and M10.

The gate of the ninth NMOS transistor M9 is connected to the drain of the first PMOS transistor M1. The drain of the ninth NMOS transistor M9 is connected to the first power supply node 1. On the other hand, the gate of the tenth NMOS transistor M10 is connected to the drain of the second PMOS transistor M2. An output terminal 19 is connected to the drain of the tenth NMOS transistor M10.

The fifth NMOS transistor M5 performs an operation of extracting a fixed amount of current flowing into the second bias supply source 16 from the second PMOS transistor M2. Similarly, the eighth NMOS transistor M8 performs an operation of extracting a fixed amount of current flowing into the first bias supply source 14 from the first PMOS transistor M1.

The ratio in drain current between the fourth and fifth NMOS transistors M4 and M5 constituting the first current mirror circuit 15, and the ratio in drain current between the seventh and eighth NMOS transistors M7 and M8 constituting the second current mirror circuit 17 are each set to 1:n.

Assuming in the above circuit arrangement that an input signal voltage Vin of the signal input terminal 11 is Vin and the conductance of each of the first and second PMOS transistors M1 and M2 is gm1, an output signal current i of the first differential pair of transistors M1 and M2 in the input stage, is expressed as follows:

$$i = (gm1/2) \times Vin \tag{1}$$

If the constant current of the first constant-current source 13 is 2×I, the transistors M1 and M2 of the first differential pair have drain currents I+i and I−i, respectively.

If the drain current of the third and fourth NMOS transistors M3 and M4 constituting the first bias supply source 14 is I'+i' and that of the sixth and seventh NMOS transistors M6 and M7 constituting the second bias supply source 16 is I'−i', the direct-current component I' is given by:

$$I' = I/(1+n) \tag{2}$$

The alternating-current component i' is expressed as:

$$i' = i/(1-n) \tag{3}$$

The third to eighth NMOS transistors M3 to M8 serve as a load of the first differential pair of transistors M1 and M2. Thus, a voltage v0 generated on the drains of the first and second NMOS transistors M1 and M2 corresponds to an input voltage of the second differential pair of transistors M9 and M10 in the output stage. Assuming that the conductance of each of the third, fourth, sixth and seventh NMOS transistors M3, M4, M6 and M7 is expressed by gm3, an input voltage v0 of the second differential pair of transistors M9 and M10 is given by the following equation:

$$v0 = 4 \times (1/gm3) \times i' \tag{4}$$

If the conductance of the second differential pair of transistors M9 and M10 is gm2, the output current i0 thereof is expressed as follows:

$$i0 = (gm2/2) \times v0 \tag{5}$$

From the above equations (1), (3), (4) and (5), the following equation is obtained:

$$i0 = 2/(1-n) \times (gm2/gm3) \times (gm1/2) \times Vin \tag{6}$$

Assuming here that the third and fourth NMOS transistors M3 and M4, sixth and seventh NMOS transistors M6 and M7, and ninth and tenth NMOS transistors M9 and M10 have the same characteristic constant k (which depends on gate width, gate length, dielectric constant of gate insulation film, and capacity of gate insulation film), the following is derived from the above equation (2):

$$gm2/gm3 = (I/I')^{1/2} = (1+n)^{1/2} \quad (7)$$

The following is also derived from the above equations (6) and (7):

$$i0 = 2 \times (1+n)^{1/2}/(1-n) \times (gm1/2) \times Vin \quad (8)$$

The conductance of the limiter amplifier so constituted is $2 \times (1+n)^{1/2}/(1-n)$ times as large as that of the first differential pair of transistors M1 and M2. If, therefore, the current mirror ratio n of each of the first and second current mirror circuits 15 and 17 is 0.7, the above conductance of the limiter amplifier becomes 8.7 times as large as that of the first differential pair of transistors M1 and M2.

More specifically, the limiter amplifier according to the first embodiment of the present invention includes a plurality of series-connected NMOS transistors (M3, M4) and (M6, M7) each having a drain and a gate connected to each other, as a load transistor of the first and second NMOS transistors M1 and M2 constituting the first differential pair in the input stage. Feedback is performed on the first differential pair of transistors M1 and M2 by the fifth and eighth NMOS transistors M5 and M8 current-mirror-connected to the load transistors (fourth and seventh NMOS transistors) M4 and M7, respectively. Thus, the load impedance of the first differential pair of transistors M1 and M2 is increased. The output of the first and second NMOS transistors M1 and M2 constituting the first differential pair in the input stage is amplified by the ninth and tenth NMOS transistors M9 and M10 constituting the second differential pair in the output stage.

According to the circuit arrangement described above, the limiter amplifier is virtually increased in conductance and thus allowed to have a high gain by varying the current mirror ratio n of each of the first and second current mirror circuits 15 and 17. Consequently, in this limiter amplifier using a differential pair of MOS transistors, a gain can easily be heightened without greatly increasing the power consumption or the area of an integrated circuit.

Furthermore, in the foregoing circuit arrangement, the limiter amplifier can be used as a comparator if a bias voltage is set to a desired value.

The first and second constant-current sources 13 and 18 can be constituted of either a MOS transistor or a bipolar transistor.

(Second Embodiment)

Figure 3:
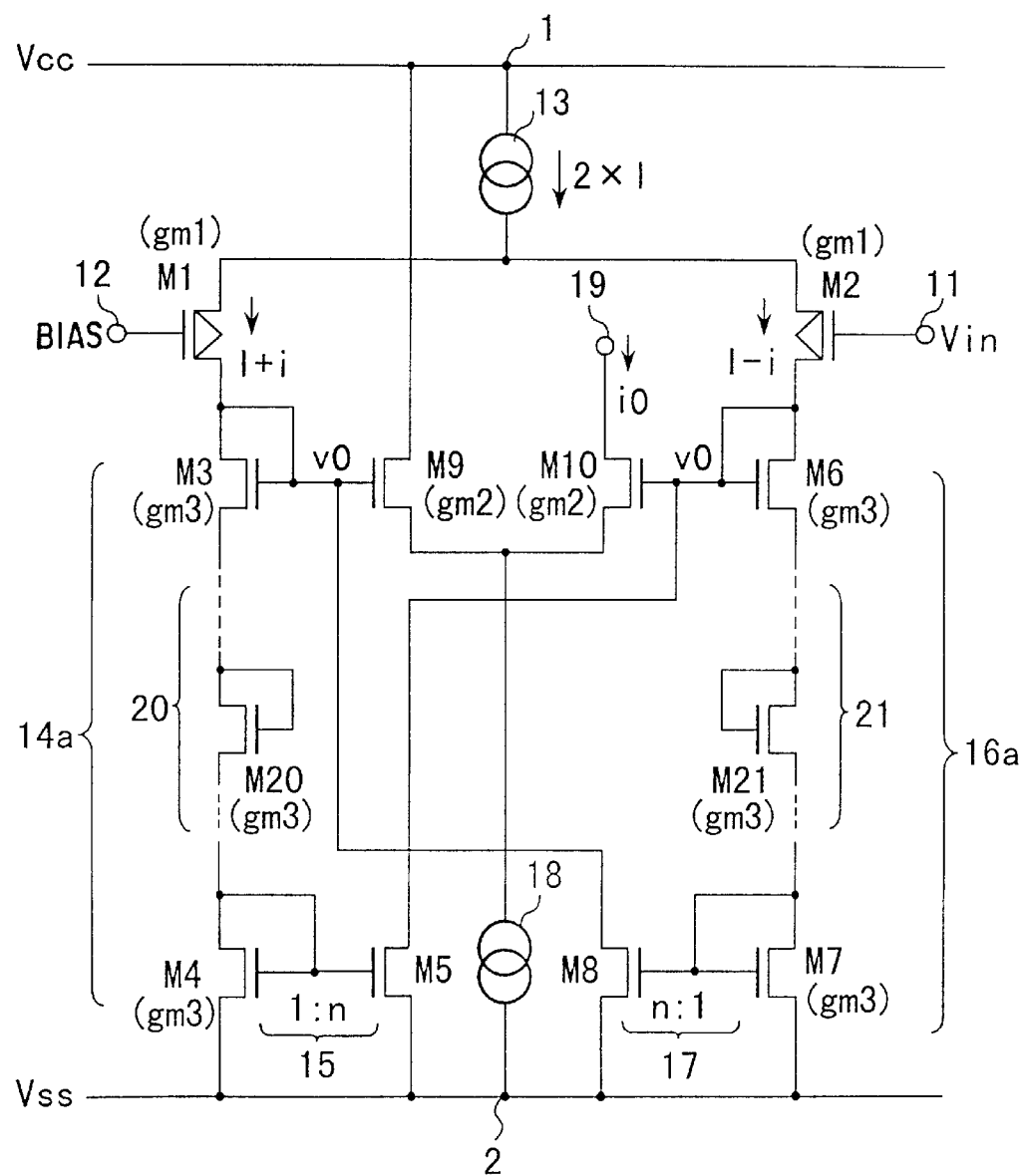
FIG. 3 is a circuit diagram schematically showing a limiter amplifier according to a second embodiment of the present invention.

FIG. 3 shows an example of an arrangement of a limiter amplifier (a PMOS top type amplifier circuit) according to a second embodiment of the present invention.

The limiter amplifier shown in FIG. 3 differs from that shown in FIG. 2 only in the arrangement of first and second bias supply sources 14a and 16a. The same constituting elements as those of the amplifier of the second embodiment are denoted by the same reference numerals and their detailed descriptions are omitted.

Referring to FIG. 3, the first bias supply source 14a is constituted of a third NMOS transistor M3, a fourth NMOS transistor M4, and a first MOS transistor group 20 connected between the source of the transistor M3 and the drain of the transistor M4. The first MOS transistor group 20 includes N NMOS transistors M20 connected in series. The drain and gate of each of the transistors M20 are connected to each other. Similarly, the second bias supply source 16a is constituted of a sixth NMOS transistor M6, a seventh NMOS transistor M7, and a second MOS transistor group 21 connected between the source of the transistor M6 and the drain of the transistor M7. The second MOS transistor group 21 includes N NMOS transistors M21 connected in series. The drain and gate of each of the transistors M21 are connected to each other.

If, in the above arrangement, the conductance of each of the transistors M20 and M21 is gm3 which is equal to that of each of the transistors M3, M4, M6 and M7, the operations corresponding to the above equations (1) to (8) of the first embodiment are basically performed. However, the output current i0 of the second differential pair of transistors M9 and M10 in the output stage, which corresponds to the equation (8), is given by the following equation (9).

$$i0 = (N+2) \times (1+n)^{1/2}/(1-n) \times (gm1/2) \times Vin \quad (9)$$

Consequently, an increase in the numbers N of transistors M20 and M21 of the first and second MOS transistor groups 20 and 21, allows the gain of the limiter amplifier to be easily heightened greatly.

(Third Embodiment)

A limiter amplifier (not shown) according to a third embodiment of the present invention corresponds to that shown in FIG. 2 which has a difference between the characteristic constant k1 of the second differential pair of transistors M9 and M10 in the output stage and the characteristic constant k2 of each of the third, fourth, sixth and seventh NMOS transistors M3, M4, M6 and M7 serving as load transistors. Specifically, the ratio of gate width to gate length in the NMOS transistors M9 and M10 and that in the NMOS transistors M3, M4, M6 and M7 are caused to differ from each other.

According to the above arrangement, basically, the operations corresponding to the above equations (1) to (8) of the first embodiment are carried out. However, gm2/gm3 in the equation (7) is given by the following equation (10):

$$gm2/gm3 = (k1 \cdot I/k2 \cdot I')^{1/2}$$
$$= (1+n)^{1/2} \times (k1/k2)^{1/2} \quad (10)$$

The output current i0 of the second differential pair of transistors M9 and M10 in the output stage, which corresponds to the above equation (8), is expressed as follows:

$$i0 = 2 \times (1+n)^{1/2}/(1-n) \times (k1/k2)^{1/2} \times (gm1/2) \times Vin \quad (11)$$

Consequently, the ratio of gate width to gate length in the ninth and tenth NMOS transistors M9 and M10 and that in the sixth and seventh NMOS transistors M6 and M7 are caused to differ from each other thereby to increase the conductance of the limiter amplifier by $(k1/k2)^{1/2}$ times.

(Fourth Embodiment)

A limiter amplifier (not shown) according to a fourth embodiment of the present invention corresponds to that shown in FIG. 3 which has a difference between the characteristic constant k1 of the second differential pair of transistors M9 and M10 in the output stage and the characteristic constant k2 of each of the third, fourth, sixth and seventh NMOS transistors M3, M4, M6 and M7 serving as load transistors and each of the transistors M20 and M21 of the first and second MOS transistor groups 20 and 21. This arrangement thus produces the advantages of the limiter amplifiers according to the second and third embodiments.

(Fifth Embodiment)

The above-described limiter amplifier according to the first to fourth embodiments is directed to a so-called PMOS top type amplifier circuit in which the common source-connection node of the first differential pair of transistors M1 and M2 is connected to the power supply node 1 on the higher-potential side through the first constant-current source 13. In this PMOS top type amplifier circuit, the bias potential of the second PMOS transistor M2 is closer to the power supply voltage Vcc than to the ground voltage Vss; therefore, the limiter amplifiers of the first to fourth embodiments are suitable for amplifying an input signal when the bias potential is closer to the power supply voltage Vcc than to the ground voltage Vss. In all the first to fourth embodiments, an NMOS top type amplifier circuit can be constituted.

Figure 4:
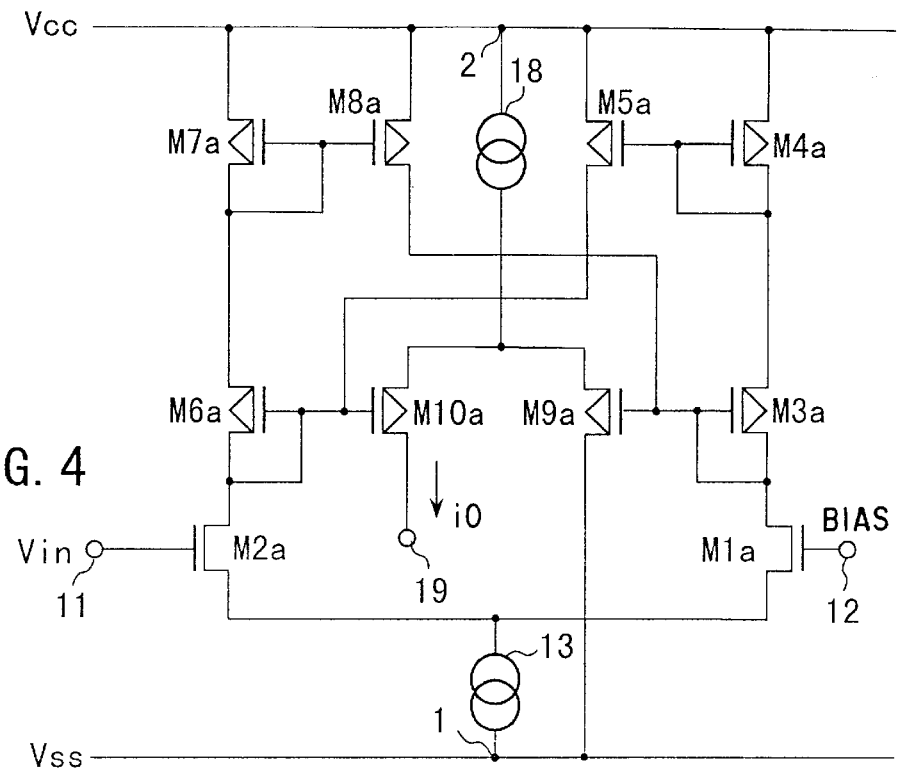
FIG. 4 is a circuit diagram schematically showing a limiter amplifier according to a fifth embodiment of the present invention.

FIG. 4 illustrates an example of an arrangement of a limiter amplifier according to a fifth embodiment of the present invention.

The limiter amplifier shown in FIG. 4 corresponds to that shown in FIG. 2 in which an NMOS top type amplifier circuit is constituted by replacing the PMOS and NMOS transistors with each other and reversing a relationship in potential between the first and second power supply nodes 1 and 2. The same constituting elements as those of the amplifier shown in FIG. 2 are denoted by the same reference numerals and their detailed descriptions are omitted.

Referring to FIG. 4, NMOS transistors M1a and M2a are used as a first differential pair of transistors in the input stage and so are PMOS transistors M9a and M10a as a second differential pair of transistors in the output stage. Moreover, PMOS transistors M3a, M4a, M6a and M7a used as load transistors and so are PMOS transistors M5a and M8a as transistors for a current mirror. A ground potential Vss is applied to the first power supply node 1, and a power supply voltage Vcc is applied to the second power supply node 2.

The operation of the limiter amplifier shown in FIG. 4 is basically the same as that of the limiter amplifier shown in FIG. 2. However, the bias potential of the first and second NMOS transistors M1a and M2a is closer to the ground potential Vss than to the power supply voltage Vcc. Therefore, the limiter amplifier of the fifth embodiment is suitable for amplifying an input signal when the bias potential is closer to the ground potential Vss.

(Sixth Embodiment)

In the foregoing limiter amplifiers according to the first to fifth embodiments, MOS transistors of a conductivity type opposite to that of first and second differential pairs of transistors in the input stage are employed as load transistors. Of the load transistors, the load transistors other than those constituting a current mirror can be formed of MOS transistors having the same conductivity type as that of the first and second differential pairs of transistors.

Figure 5:
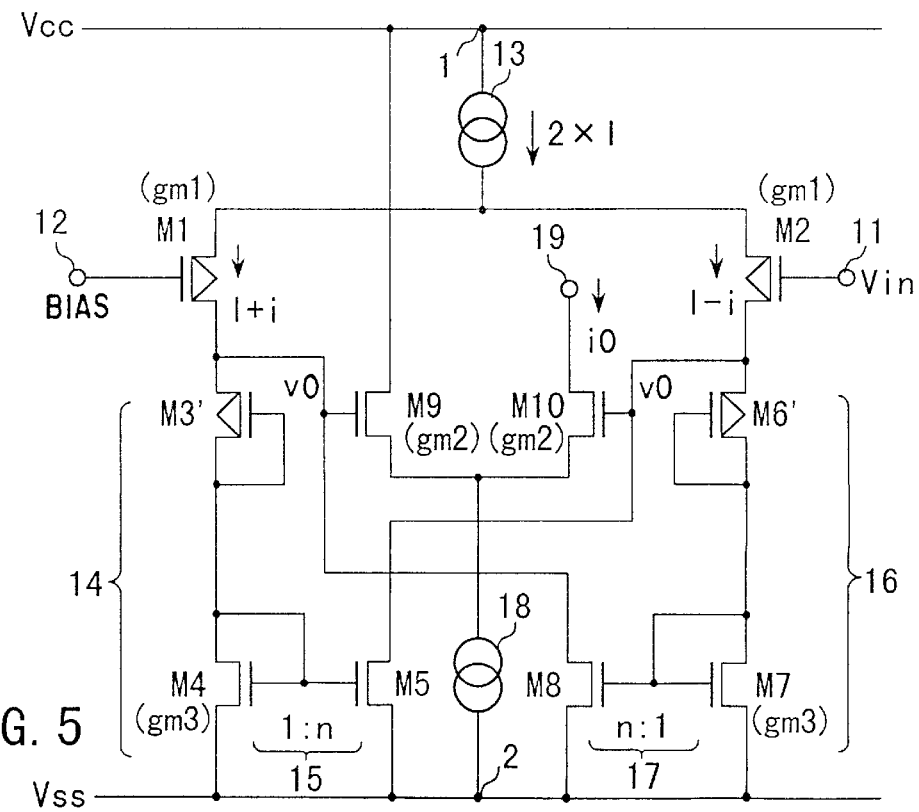
FIG. 5 is a circuit diagram schematically showing a limiter amplifier according to a sixth embodiment of the present invention.

FIG. 5 shows an example of an arrangement of a limiter amplifier (a PMOS top type amplifier circuit) according to a sixth embodiment of the present invention.

In the limiter amplifier shown in FIG. 5, PMOS transistors M3' and M6' the gate and drain of each of which are connected to each other, are used in place of the load transistors M3 and M6 serving as the loads of the first differential pair of transistors M1 and M2 in the input stage in the limiter amplifier shown in FIG. 2. The same constituting elements as those of the limiter amplifier shown in FIG. 2 are indicated by the same reference numerals and their detailed descriptions are omitted.

The limiter amplifier according to the sixth embodiment performs basically the same operation as that of the limiter amplifier shown in FIG. 2, though the load transistors M3', M4, M6' and M7 are varied in conductance from one another. In this arrangement, too, therefore, the limiter amplifier can easily be increased in gain, using a differential pair of MOS transistors, without greatly increasing in current consumption and area of an integrated circuit.

Needless to say, various changes and modifications can be made without departing from the scope of the subject matter of the present invention.

According to the present invention described above, even when a differential pair of MOS transistors is employed in the input stage of an integrated circuit, a high gain can easily be obtained without greatly increasing in current consumption and area of the circuit.

Since the analog signal amplifier circuit is virtually increased in conductance, a high gain can be achieved by varying the current mirror ratio n of each of the current mirror circuits 15 and 17.

If a plurality of MOS transistors M20 and M21 are added further as loads of the differential pair of transistors M1(M1a) and M2(M2a) in the input stage, a higher gain can be obtained.

If, moreover, a ratio of gate width to gate length of the differential pair of transistors M9 and M10 in the output stage and that of gate width to gate length of the load transistors M3, M4, M6 and M7 are caused to differ from each other, a high gain can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A signal amplifier circuit comprising:

a first differential pair of a first MOS transistor of a first conductivity type and a second MOS transistor of the first conductivity type, a source of the first MOS transistor and a source of the second MOS transistor being connected to each other;

a first constant-current source connected to a common source-connection node of the first and second MOS transistors of the first differential pair;

a first bias supply source connected to a drain of the first MOS transistor and comprised of a third MOS transistor and a fourth MOS transistor of a second conductivity type connected in series, a drain and a gate of the third MOS transistor being connected to each other and a drain and a gate of the fourth MOS transistor being connected to each other;

a fifth MOS transistor of the second conductivity type constituting a first current mirror circuit together with the fourth MOS transistor, a gate and a source of the fifth MOS transistor being connected to the gate and a source of the fourth MOS transistor respectively, and a drain of the fifth MOS transistor being connected to a drain of the second MOS transistor;

a second bias supply source connected to the drain of the second MOS transistor and comprised of a sixth MOS transistor and a seventh MOS transistor of the second conductivity type connected in series, a drain and a gate of the sixth MOS transistor being connected to each other and a drain and a gate of the seventh MOS transistor being connected to each other;

an eighth MOS transistor of the second conductivity type constituting a second current mirror circuit together with the seventh MOS transistor, a gate and a source of the eighth MOS transistor being connected to the gate and a source of the seventh MOS transistor respectively, and a drain of the eighth MOS transistor being connected to the drain of the first MOS transistor;

a second differential pair of a ninth MOS transistor of the second conductivity type and a tenth MOS transistor of the second conductivity type, a source of the ninth MOS transistor and a source of the tenth MOS transistor being connected to each other, a gate of the ninth MOS transistor being connected to the drain of the first MOS transistor, and a gate of the tenth MOS transistor being connected to the drain of the second MOS transistor; and a second constant-current source connected to a common source-connection node of the ninth and tenth MOS transistors of the second differential pair.

2. A signal amplifier circuit according to claim 1, wherein the third MOS transistor is of the second conductivity type, and the sixth MOS transistor is of the second conductivity type.

3. A signal amplifier circuit according to claim 1, wherein the first bias supply source includes a first MOS transistor group connected between a source of the third MOS transistor and the drain of the fourth MOS transistor and having one or more MOS transistors which are connected in series and each of which has a drain and a gate connected to each other; and the second bias supply source includes a second MOS transistor group connected between a source of the sixth MOS transistor and the drain of the seventh MOS transistor and having one or more MOS transistors which are connected in series and each of which has a drain and a gate connected to each other.

4. A signal amplifier circuit according to claim 3, wherein the MOS transistors of the first and second MOS transistor groups are of the second conductivity type.

5. A signal amplifier circuit according to claim 1, wherein a current mirror ratio of the first current mirror circuit is substantially equal to that of the second current mirror circuit.

6. A signal amplifier circuit according to claim 1, wherein a ratio of gate width to gate length of each of the transistors of the first and second bias supply sources differs from that of gate width to gate length of each of the MOS transistors of the second differential pair.

7. A signal amplifier circuit according to claim 1, wherein the MOS transistors of the first conductivity type are PMOS transistors, the MOS transistors of the second conductivity type are NMOS transistors, one end of the first constant-current source and a drain of the ninth MOS transistor are connected to a first power supply node, and one end of the second constant-current source and the sources of the fourth, fifth, seventh and eighth MOS transistors are connected to a second power supply node which is lower than the first power supply node.

8. A signal amplifier circuit according to claim 1, wherein the MOS transistors of the first conductivity type are NMOS transistors, the MOS transistors of the second conductivity type are PMOS transistors, one end of the first constant-current source and a drain of the ninth MOS transistor are connected to a first power supply node, and one end of the second constant-current source and the sources of the fourth, fifth, seventh and eighth MOS transistors are connected to a second power supply node which is higher than the first power supply node.

9. A signal amplifier circuit comprising:

a first differential pair of a first MOS transistor of a first conductivity type and a second MOS transistor of the first conductivity type, a source of the first MOS transistor and a source of the second MOS transistor being connected to each other;

a first constant-current source connected to a common source-connection node of the first and second MOS transistors of the first differential pair;

a third MOS transistor and a fourth MOS transistor of a second conductivity type connected in series to a drain of the first MOS transistor, a drain and a gate of each of the third MOS transistor and the fourth MOS transistor being connected to each other;

a fifth MOS transistor of the second conductivity type whose gate and source are connected to the gate and a source of the fourth MOS transistor respectively and whose drain is connected to a drain of the second MOS transistor;

a sixth MOS transistor and a seventh MOS transistor of the second conductivity type connected in series to the drain of the second MOS transistor, a drain and a gate of each of the sixth MOS transistor and the seventh MOS transistor being connected to each other;

an eighth MOS transistor of the second conductivity type whose gate and source are connected to the gate and a source of the seventh MOS transistor respectively and whose drain is connected to a drain of the first MOS transistor;

a second differential pair of a ninth MOS transistor of the second conductivity type and a tenth MOS transistor of the second conductivity type, a source of the ninth MOS transistor and a source of the tenth MOS transistor being connected to each other, a gate of the ninth MOS transistor being connected to the drain of the first MOS transistor, and a gate of the tenth MOS transistor being connected to the drain of the second MOS transistor; and a second constant-current source connected to a common source-connection node of the ninth and tenth MOS transistors of the second differential pair.

10. A signal amplifier circuit according to claim 9, wherein the third MOS transistor is of the second conductivity type, and the sixth MOS transistor is of the second conductivity type.

11. A signal amplifier circuit according to claim 9, wherein the fourth and fifth MOS transistors constitute a first current mirror circuit and the seventh and eighth MOS transistors constitute a second current mirror circuit, a current mirror ratio of the first current mirror circuit being substantially equal to that of the second current mirror circuit.

12. A signal amplifier circuit according to claim 9, wherein a ratio of gate width to gate length of each of the third, fourth, sixth and seventh MOS transistors differs from that of gate width to gate length of each of the ninth and tenth MOS transistors.

13. A signal amplifier circuit according to claim 9, wherein the MOS transistors of the first conductivity type are PMOS transistors, the MOS transistors of the second conductivity type are NMOS transistors, one end of the first constant-current source and a drain of the ninth MOS transistor are connected to a first power supply node, and one end of the second constant-current source and the sources of the fourth, fifth, seventh and eighth MOS transistors are connected to a second power supply node which is lower than the first power supply node.

14. A signal amplifier circuit according to claim 9, wherein the MOS transistors of the first conductivity type are NMOS transistors, the MOS transistors of the second conductivity type are PMOS transistors, one end of the first constant-current source and a drain of the ninth MOS transistor are connected to a first power supply node, and one end of the second constant-current source and the sources of the fourth, fifth, seventh and eighth MOS transistors are connected to a second power supply node which is higher than the first power supply node.

15. A signal amplifier circuit comprising:

a first differential pair of a first MOS transistor of a first conductivity type and a second MOS transistor of the first conductivity type, a source of the first MOS transistor and a source of the second MOS transistor being connected to each other;

a first constant-current source connected to a common source-connection node of the first and second MOS transistors of the first differential pair;

a third MOS transistor and a fourth MOS transistor of a second conductivity type connected in series to a drain of the first MOS transistor, a drain and a gate of each of the third MOS transistor and the fourth MOS transistor being connected to each other;

a first MOS transistor group connected between a source of the third MOS transistor and the drain of the fourth MOS transistor and constituted of one or more series-connected MOS transistors each having a drain and a gate connected to each other;

a fifth MOS transistor of the second conductivity type whose gate and source are connected to the gate and a source of the fourth MOS transistor respectively and whose drain is connected to a drain of the second MOS transistor;

a sixth MOS transistor and a seventh MOS transistor of the second conductivity type connected in series to the drain of the second MOS transistor, a drain and a gate of each of the sixth MOS transistor and the seventh MOS transistor being connected to each other;

a second MOS transistor group connected between a source of the sixth MOS transistor and the drain of the seventh MOS transistor and constituted of one or more series-connected MOS transistors each having a drain and a gate connected to each other;

an eighth MOS transistor of the second conductivity type whose gate and source are connected to the gate and a source of the seventh MOS transistor respectively and whose drain is connected to a drain of the first MOS transistor;

a second differential pair of a ninth MOS transistor of the second conductivity type and a tenth MOS transistor of the second conductivity type, a source of the ninth MOS transistor and a source of the tenth MOS transistor being connected to each other, a gate of the ninth MOS transistor being connected to the drain of the first MOS transistor, and a gate of the tenth MOS transistor being connected to the drain of the second MOS transistor; and a second constant-current source connected to a common source-connection node of the ninth and tenth MOS transistors of the second differential pair.

16. A signal amplifier circuit according to claim 15, wherein the third MOS transistor is of the second conductivity type, the sixth MOS transistor is of the second conductivity type, and the MOS transistors of the first and second MOS transistor groups are of the second conductivity type.

17. A signal amplifier circuit according to claim 15, wherein the fourth and fifth MOS transistors constitute a first current mirror circuit and the seventh and eighth MOS transistors constitute a second current mirror circuit, a current mirror ratio of the first current mirror circuit being substantially equal to that of the second current mirror circuit.

18. A signal amplifier circuit according to claim 15, wherein a ratio of gate width to gate length of each of the third, fourth, sixth and seventh MOS transistors, and each of the MOS transistors of the first and second MOS transistor groups different from that of gate width to gate length of each of the ninth and tenth MOS transistors.

19. A signal amplifier circuit according to claim 15, wherein the MOS transistors of the first conductivity type are PMOS transistors, the MOS transistors of the second conductivity type are NMOS transistors, one end of the first constant-current source and a drain of the ninth MOS transistor are connected to a first power supply node, and one end of the second constant-current source and the sources of the fourth, fifth, seventh and eighth MOS transistors are connected to a second power supply node which is lower than the first power supply node.

20. A signal amplifier circuit according to claim 15, wherein the MOS transistors of the first conductivity type are NMOS transistors, the MOS transistors of the second conductivity type are PMOS transistors, one end of the first constant-current source and a drain of the ninth MOS transistor are connected to a first power supply node, and one end of the second constant-current source and the sources of the fourth, fifth, seventh and eighth MOS transistors are connected to a second power supply node which is higher than the first power supply node.

* * * * *